(12) United States Patent  (10) Patent No.: US 6,717,523 B2
Sugiyama  (45) Date of Patent: Apr. 6, 2004

(54) PHOTOELECTRIC SWITCH

(75) Inventor: Kazutoshi Sugiyama, Osaka (JP)

(73) Assignee: Keyence Corporation, Osaka (JP)

( * ) Notice: Subject to any disclaimer, the term of this patent is extended or adjusted under 35 U.S.C. 154(b) by 57 days.

(21) Appl. No.: 10/055,033

(22) Filed: Jan. 25, 2002

(65) Prior Publication Data

US 2002/0163485 A1 Nov. 7, 2002

(30) Foreign Application Priority Data

Mar. 15, 2001 (JP) ..................... P.2001-073338

(51) Int. Cl.$^7$ ................................. G08B 5/00
(52) U.S. Cl. ............... 340/815.4; 250/221; 340/815.44; 340/815.45
(58) Field of Search ............. 340/815.4, 815.44, 340/815.45, 691.6, 555, 556; 250/221, 222.1; 345/39, 33–35

(56) References Cited

U.S. PATENT DOCUMENTS

| 5,347,117 | A | | 9/1994 | Fooks et al. |
| 5,712,477 | A | * | 1/1998 | Delaney, III et al. ........ 250/221 |
| 5,808,296 | A | * | 9/1998 | McMonagle et al. ........ 250/221 |
| 6,011,467 | A | | 1/2000 | Kamei et al. |
| 6,084,524 | A | | 7/2000 | Sato |
| 6,211,784 | B1 | | 4/2001 | Nishide |
| 6,414,603 | B1 | * | 7/2002 | Yamaguchi et al. ...... 340/815.4 |
| 6,555,806 | B2 | * | 4/2003 | Okamoto .................... 250/221 |
| 2002/0130822 | A1 | * | 9/2002 | Fukumura .................... 345/39 |

FOREIGN PATENT DOCUMENTS

| EP | 797107 A2 | 9/1997 |
| JP | 7-92266 A | 4/1995 |
| JP | 9-252242 A | 9/1997 |

* cited by examiner

Primary Examiner—Thomas J Mullen
(74) Attorney, Agent, or Firm—Smith Patent Office

(57) ABSTRACT

In a first display mode, a threshold value is numerically displayed on a first display section and the current light reception amount (current value) is numerically displayed on a second display section. In a second display mode, the tolerance value is numerically displayed on the first display section and the current light reception amount is numerically displayed on the second display section. To switch from the first display mode to the second display mode, a display mode change key can be operated.

34 Claims, 12 Drawing Sheets

PRIOR ART
FIG.13
(CURRENT VALUE) (THRESHOLD VALUE)
1234  300
100P  300
(TOLERANCE) (THRESHOLD VALUE)

PHOTOELECTRIC SWITCH

BACKGROUND OF THE INVENTION

1. Field of the Invention

This invention relates to a photoelectric switch, and in particular to a photoelectric switch of a dual display type comprising two display sections.

2. Discussion of the Related Art

A photoelectric switch is frequently used to detect the presence or absence of a detected object using light. One of the known photoelectric switches comprises a display section, for example, those disclosed in Japanese Patent Unexamined Publication No. Hei. 7-92266 and Japanese Patent Unexamined Publication No. Hei. 9-252242. According to this kind of photoelectric switch, the current light reception amount can be displayed on the display section. In addition, the setup threshold value can also be numerically displayed on the display section. Therefore, while the displayed threshold value is visually checked, the threshold value can be finely adjusted.

A photoelectric switch of a dual display type provided with two display sections has also been proposed. In the photoelectric switch comprising the two display sections in the related art, a first display mode, where a first display information (a current light reception amount and a threshold value) is displayed on the two display sections, and a second display mode, where a second display information (a tolerance value and a threshold value) is displayed on the two display sections, can be switched (selected), as shown in FIG. 13. When the first display mode is selected, a current light reception amount is numerically displayed on the first display section and a threshold value is numerically displayed on the second display section. When the second display mode is selected, a tolerance value is displayed on the first display section and the threshold value is numerically displayed on the second display section. The tolerance value can be defined by the following expression:

Tolerance=current light reception amount/threshold value

According to the photoelectric switch of the dual display type, the threshold value is numerically displayed on the second display section no matter which display mode is selected, so that while the numeric change in the threshold value is visually checked, the threshold value can be finely adjusted.

However, when the threshold value is finely adjusted in such an environment where the presence or absence of a detected object is detected under a small threshold value, if on the second display mode, the threshold value is changed while the tolerance value, namely, the relative value of the light reception amount to the threshold value is seen, a large value is displayed as the tolerance value even if the light reception amount is small. Therefore, the photoelectric switch reaches its performance limit because of, for example, a poor detection environment, etc. Thus, it is feared that the worker may be confident that the threshold value is correctly set by seeing only the tolerance value.

SUMMARY OF THE INVENTION

It is therefore an object of the invention to provide a photoelectric switch that enables the operator not only to finely adjust a threshold value appropriately, but also to be prompted to reassess the detection environment.

The above-mentioned object and other objects of the invention can be achieved by a photoelectric switch, according to the invention, comprising: a first display section and a second display section, for displaying one of a first display information and a second display information, wherein the first display information has a threshold value displayed on the first display section and a current light reception amount displayed on the second display section, and the second display information has a tolerance value displayed on the first display section and the current light reception amount displayed on the second display section.

Using a photoelectric switch comprising two display sections, the inventor of the application examined what contents should be displayed most effectively on the first and second display sections.

It is true that adjusting the threshold value while making a comparison between the threshold value and the tolerance value as in the related art provides a feeling of safety because the worker can adjust the threshold value while visually checking the numeric value of the threshold value to be changed. However, this ability is not very significant. To change the threshold value, it is important to correctly adjust the threshold value rather than to know the numeric value of the threshold value. Therefore, if the tolerance value is observed apart from insistence of displaying the threshold value, originally the threshold value itself is contained in the tolerance as a parameter. Therefore, if the threshold value is adjusted while a comparison is made between the tolerance value (containing the threshold value as a parameter) and the current light reception amount, adjustment of the threshold value is not hindered. When the current light reception amount is extremely small, even if the tolerance is large, the operator can be given a chance to examine why the light reception amount is so small.

Thus, while adjusting the threshold value, the operator can reassess the detection environment to, for example, determine whether or not proper light is being applied to the detected object, and whether or not dust is being deposited on the light reception element or the light transmission element of the photoelectric switch, etc.

For example, if the first or second display section is implemented as two-color LEDs, when the photoelectric switch is close to the performance limit thereof, such as when the tolerance is large and the light reception amount is extremely small, then the first or second display section may be displayed in a different color from the normal color so as to prompt the worker to reassess the detection environment.

The maximum value of the light reception amount may be displayed on one of the two display sections and the minimum value of the light reception amount may be displayed on the other at the same time. In so doing, the worker can know whether or not the light reception amount, namely, the detection amount difference (the difference between the maximum value and the minimum value) is sufficient for detecting the presence or absence of a detected object if the detected object moves at a high speed in the detection area.

BRIEF DESCRIPTION OF THE DRAWINGS

The above and other objects and features of the present invention will be clearly understood from the following description with respect to the preferred embodiment thereof when considered in conjunction with the accompanying drawings and diagrams, in which:

FIG. 13 is a schematic diagram showing the contents displayed on a photoelectric switch comprising two display sections in the related art.

DETAILED DESCRIPTION OF THE PREFERRED EMBODIMENTS

Referring now to the accompanying drawings, the preferred embodiments of the invention are shown.

Figure 1:
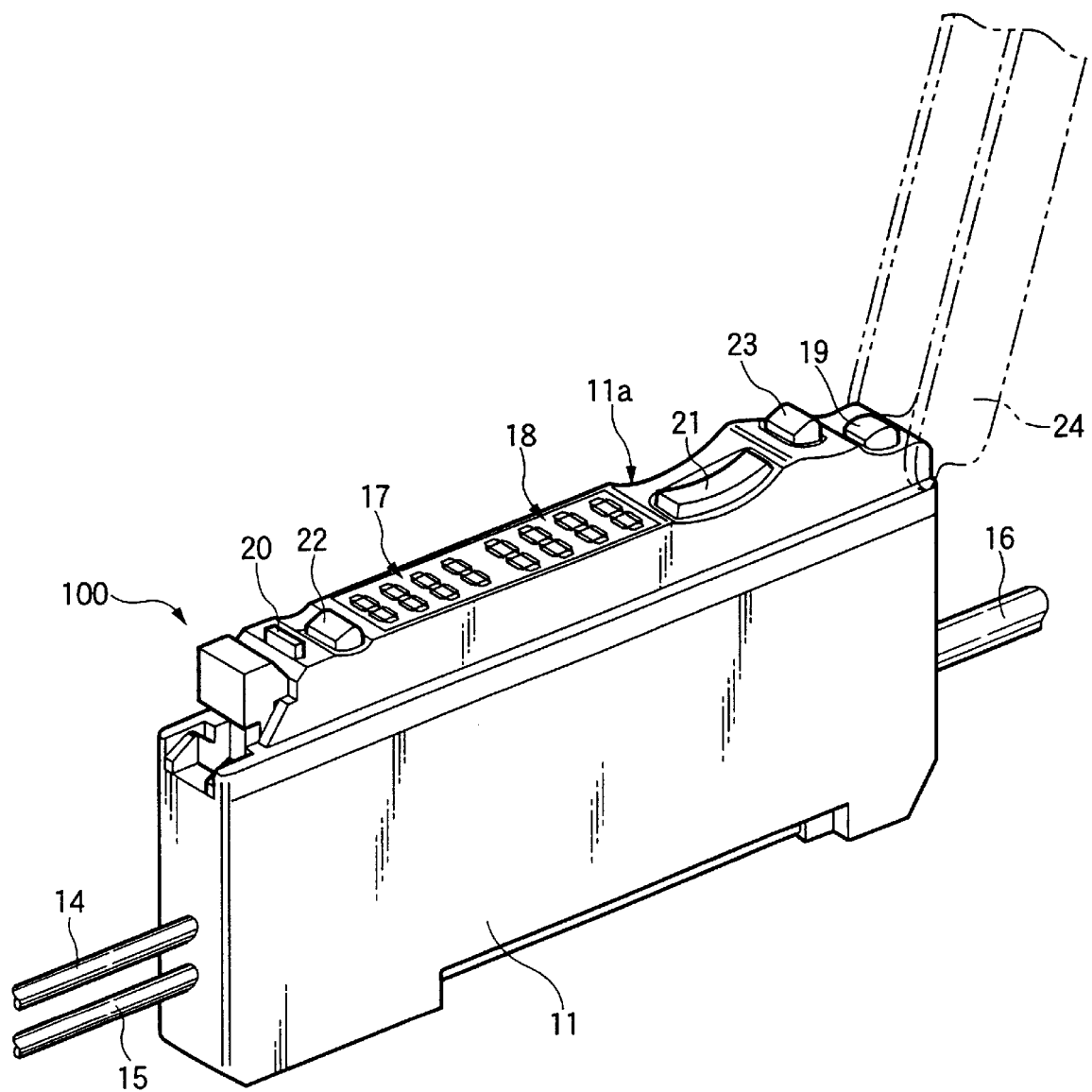
FIG. 1 is a perspective view of an integral-type photoelectric switch according to a first embodiment of the invention.
Figure 2:
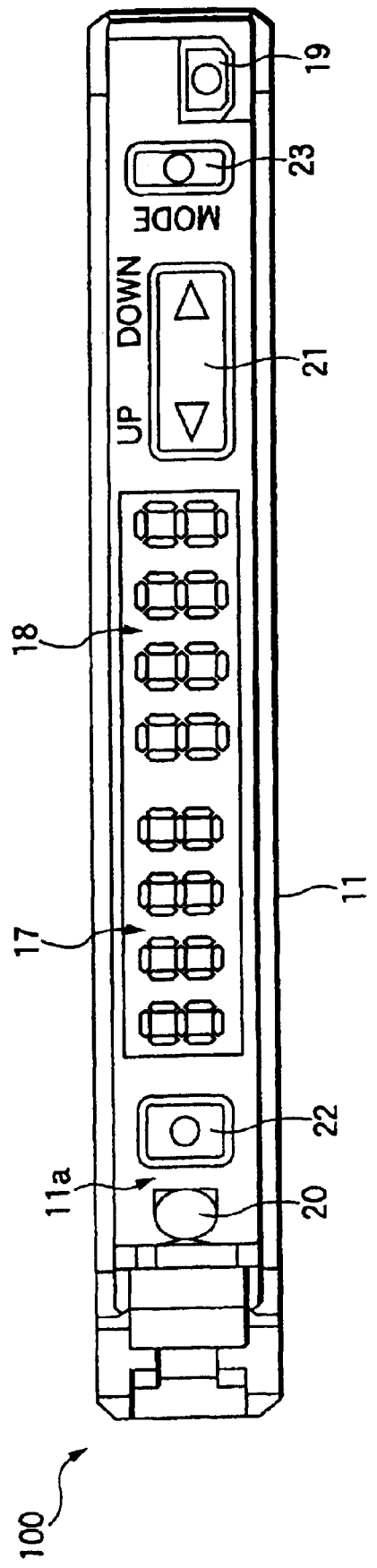
FIG. 2 is a plan view of the photoelectric switch in FIG. 1.

FIGS. 1 and 2 show a photoelectric switch according to a first embodiment of the invention. FIG. 1 is a perspective view of the photoelectric switch. FIG. 2 is a plan view of the photoelectric switch. A photoelectric switch 100 shown in the figures is a so-called reflection-type photoelectric switch for emitting light to a detected object and receiving its reflected light. The photoelectric switch 100 is also an integral-type photoelectric switch comprising a light emission element and a light reception element placed on a main unit which also includes an amplifier, a CPU, and the like.

The photoelectric switch 100 has a narrow and comparatively elongated box-like casing 11. The casing 11 contains a light emission element 12 and a light reception element 13, and optical fibers 14 and 15 facing both the elements 12 and 13 (see FIG. 3). The optical fibers 14 and 15 extend to the outside from one end face of the casing 11. Power supply to and output from the photoelectric switch 100 are performed through a cable 16 (see FIG. 1). The cable 16 extends from the other end face of the casing 11.

The casing 11 has a comparatively elongated and roughly rectangular top face 11a. As best shown in FIG. 2, first and second display sections 17 and 18 are placed adjacent in a side by side fashion in the lengthwise direction of the top face 11a of the casing 11 on the same plane of the top face 11a. As seen in FIG. 2, the width of the casing 11 is almost the same width as the first and second display sections 17, 18 (the up and down directions in FIG. 2) thereof. Each of the first and second display sections 17 and 18 has four subsections placed adjacent in a side by side fashion in the lengthwise direction of the top face 11a of the casing 11. Each subsection is implemented as a seven-segment LED. That is, each of the first and second display sections 17 and 18 can display four numbers or alphanumeric characters side by side. Therefore, for example, when a numeric value is displayed on the first or second display sections 17 or 18, a four-digit numeric value can be displayed. The seven-segment LED may be implemented as a single-color LED or as a two-color LED. The first or second display sections 17 or 18 may be implemented as a monochrome or as a color liquid crystal display (LCD).

The casing 11 has on the top face 11a, an output logic switch 19, an output on/off indicator 20, a swing-type threshold value adjustment switch (or up/down key) 21, a threshold value set switch (or key) 22, and a display mode change key 23 (simply called the M key). A one-way draw lid 24 (see FIG. 1) is attached to the other end of the top face 11a of the casing 11 via a pivot connection. The top face 11a can be covered by the lid 24.

Placement of the three switches or keys on the casing 11 will be discussed in detail. The threshold value set key 22 is placed at one end part of the casing 11 in the lengthwise direction thereof. On the other hand, the up/down key 21 and the M key 23 are placed at the other end part of the casing 11 in the lengthwise direction thereof. That is, relative to the two display sections 17 and 18 placed adjacent to one another in a side by side fashion, the threshold value set key 22 is placed on one side (left of the first display section 17), and the up/down key 21 and the M key 23 are placed on the other side (right of the second display section 18). The up/down key 21 is placed adjacent to the second display section 18 on the right. The M key 23 is placed at the right end of the casing away from the second display section 18.

Thus, the two left and right display sections 17 and 18 are placed adjacent to one another in a side by side fashion, so that two information pieces such as the threshold value, the light reception amount, etc., can be displayed side by side as described later. Thus the user can read the two information pieces without moving his or her gaze. On the narrow top face 11a of the casing 11 of the embodiment, the threshold value set switch (or key) 22 is placed on one side and the threshold value adjustment switch (up/down key) 21 is placed on the other side with the first and second display sections 17 and 18 placed side by side therebetween. Therefore, the part for setting the threshold value (the left part of the first display section 17 where the threshold value set key 22 is placed) and the part for adjusting the threshold value (the right part of the second display section 18 where the up/down key 21 is placed) are spaced a large distance from each other. Thus, there is no fear of pressing the wrong key or switch by mistake such as when one key or switch is pressed in the case where the keys or switches 21 and 22 are placed adjacent to each other.

Likewise, the threshold value set key 22 and the mode change switch (or M key) 23 involved in two different operation determinations are placed a large distance from each other with the display sections 17 and 18 therebetween. Thus there is no fear of erroneously operating the keys or switches 22 and 23.

The output on/off indicator 20 is turned on or off when indicating an output state of detecting the presence or absence of a detected object T (see FIG. 3) from the relationship between the light reception amount and the threshold value. The logic (turning on or off when the output is on) of the relationship between turning on or off of the output on/off indicator 20 and the output state can be changed by operating the output logic switch 19. The up/down key 21 is used to finely adjust the threshold value as is described later. One side or the other side of the swing-type up/down key 21 is selectively pressed, whereby the threshold value can be adjusted.

The threshold value set key 22 is used to automatically set a threshold value. That is, if the threshold value set key 22 is pressed with a detected object T (see FIG. 3) placed in a detection area and is then pressed again with the detected object T removed from the detection area, the value between the light reception amount when the detected object T exists and that when the detected object T is removed is automatically set as a threshold value. The setup threshold value is displayed on the first display section 17 or the second display section 18, as described later in more detail. The M key 23 is used to switch the display mode of the first and second display sections 17 and 18, as described later in more detail.

Figure 3:
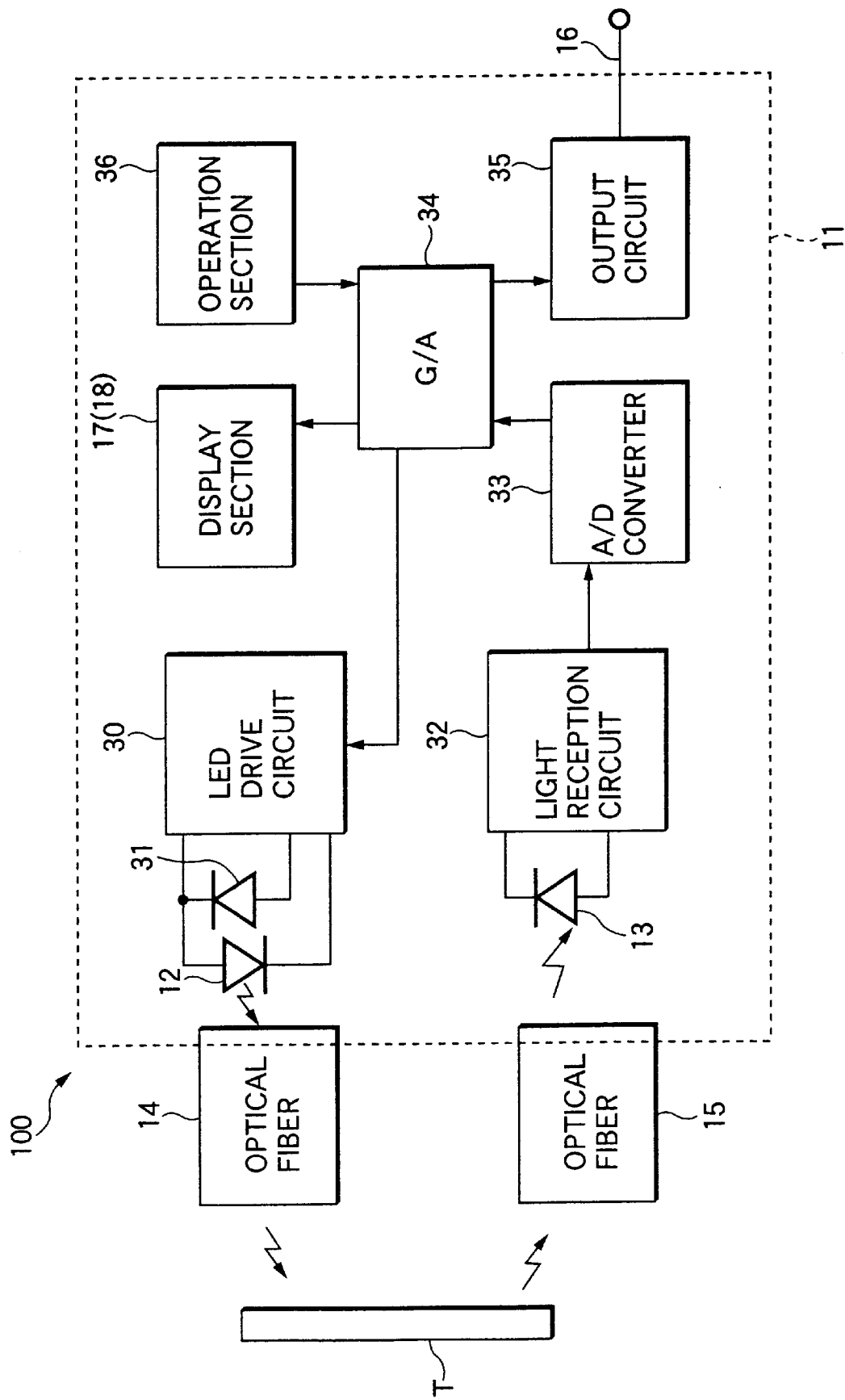
FIG. 3 is a block diagram of the photoelectric switch in FIG. 1.

FIG. 3 is a block diagram to show a whole outline of the photoelectric switch 100. The photoelectric switch 100 has a drive circuit 30, a photodiode 31 for monitoring, a light reception circuit 32, an A/D converter 33, a gate array or control circuit 34, and an output circuit 35. The drive circuit 30 causes the light emission element 12 made of a photodiode, etc., for example, to emit light. The light reception circuit 32 is connected to the light reception element 13 made of a photodiode, etc. The A/D converter 33 converts an output signal from the light reception circuit 32 from an analog form into a digital form. The gate array or control circuit 34 controls the first and second display sections 17 and 18. The output circuit 35 sends a signal from the control circuit 34 to the outside. Signals from an operation section 36 containing the switches 21 to 23 such as the threshold value adjustment switch and the display mode change switch previously described are input to the control circuit 34.

As already known, the photoelectric switch 100 compares the amount of light received by the light reception element 13 with a threshold value. Then the photoelectric switch 100 detects the presence or absence of the detected object T depending on the larger-than or less-than relationship therebetween, and outputs the result. For example, the current amount of light received by the light reception element 13 and the threshold value set to detect the presence or absence of the detected object T are displayed on the first and second display sections 17 and 18 described above. Whether the current light reception amount is to be displayed on the first display section 17 or the second display section 18 is arbitrary. That is, the current light reception amount is displayed on either the left and right display sections 17 and 18 and the threshold value is displayed on the other one. In the embodiment, the threshold value is displayed on the first display section 17 and the current light reception amount is displayed on the second display section 18.

Figure 4:
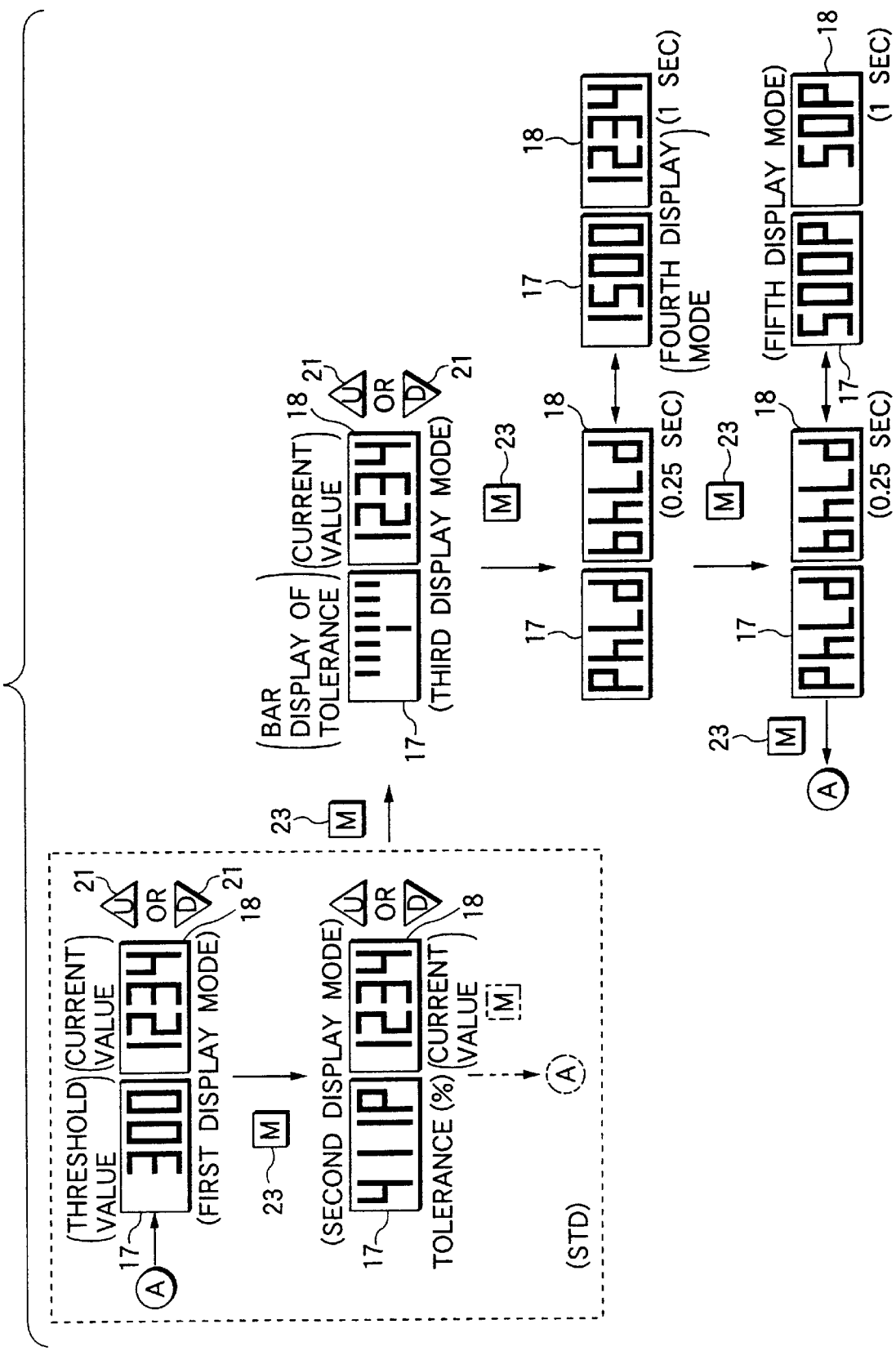
FIG. 4 is a schematic flow diagram showing display modes in the first embodiment of the invention.

FIG. 4 is a drawing to describe how to change the display mode of the first and second display sections 17 and 18 on the left and right from the first display mode to the fifth display mode, in order, as the M key 23 is operated.

First Display Mode

When the first display mode is selected, a first display information (threshold value and current light reception amount) is displayed on the first and second display sections. That is, in the first display mode, the threshold value is numerically displayed on the first display section 17 on the left, and the current light reception amount (current value) is numerically displayed on the second display section 18 on the right.

Second Display Mode

When the second display mode is selected, a second display information (the tolerance value and the current light reception amount) is displayed on the first and second display sections. That is, in the second display mode, the tolerance value is numerically displayed on the first display section 17 on the left, and the current light reception amount is numerically displayed on the second display section 18. As previously described, the tolerance value refers to a relative value of the current light reception amount to the threshold value and can be defined by the following expression:

Tolerance=current light reception amount/threshold value

The tolerance is displayed as a percentage on the second display mode. That is, the tolerance displayed on the first display section 17 can be represented by the following expression:

Tolerance (%)=(current light reception amount/threshold value)× 100

To point out explicitly that the numeric value (tolerance) in the first display section 17 is displayed as a percentage, the numeric value is followed by the letter "P" meaning percentage in the first display section 17 for the second display mode.

Third Display Mode

When the third display mode is selected, a third display information (tolerance value in bar form and current light reception amount) is displayed on the first and second display sections. That is, in the third display mode, the tolerance value is displayed on the first display section 17 on the left in a bar form, and the current light reception amount is numerically displayed on the second display section 18 on the right. As for the specific bar display in the first display section 17, seven-segment units, each of which includes four segments for displaying the part in the longitudinal direction relative to the display section and three segments for displaying the part in the lateral direction, are used. The upper two segments of the four segments forming the part in the longitudinal direction relative to the first display section 17 are used as the bar form, whereby a bar-form display is produced. In the embodiment, the first display section 17 is made up of four seven-segment units and thus a total of eight segments arranged in the lateral direction can be used to produce a bar-form display with the right segment as the origin. Further, in the embodiment, as shown in FIG. 4, the lower two segments of the four segments forming the part in the longitudinal direction relative to the first display section 17 are used to display the threshold level, and the magnitude of the displayed tolerance relative to the setup threshold value can be roughly understood. If the threshold value is adjusted or changed, the position representing the position of the threshold value on the third display mode does not change (fixed roughly to the center position in the lateral direction of the first display section 17) and the display of the tolerance value relative to the threshold value changes.

Fourth Display Mode

When the fourth display mode is selected, a fourth display information (maximum value and minimum value of light reception amounts) is displayed on the first and second display sections. That is, in the fourth display mode, the maximum value and the minimum value of light reception amounts within a given time period are displayed on the first display section 17 and the second display section 18, respectively. On the fourth display mode shown in FIG. 4, "PhLd" in the first display section 17 on the left is short for Peak Hold, namely, this means the maximum value. "bhLd" in the second display section 18 on the right is short for Bottom Hold, namely, this means the minimum value.

On the fourth display mode, first the character strings "PhLd" and "bhLd" are displayed only for about 0.25 seconds in the first and second display sections 17 and 18, and then the displays are automatically switched. Then the numeric value of the maximum value is displayed on the first display section 17 on the left and the numeric value of the minimum value is displayed on the second display section 18 on the right. The numeric display is continued for one second and then it is automatically returned to the character string display of "PhLd" and "bhLd." After this, the sequence is repeated.

Fifth Display Mode

When the fifth display mode is selected, a fifth display information (tolerances of maximum value and the minimum value) is displayed on the first and second display sections. That is, in the fifth display mode, the numeric values of converting the maximum value and the minimum value into tolerance values are displayed on the first display section 17 and the second display section 18. The tolerance value of the maximum value is represented by the following expression:

Tolerance of maximum value=maximum value/threshold value

The tolerance of the minimum value is represented by the following expression:

Tolerance of minimum value=minimum value/threshold value

The tolerance value is displayed as a percentage on the fifth display mode. That is, the tolerance displayed on the first and second display sections 17 and 18 can be represented by the following expression:

Tolerance of maximum value (%)=(maximum value/threshold value)×100

Tolerance of minimum value (%)=(minimum value/threshold value)×100

Also on the fifth display mode like the fourth display mode described above, first the character strings "PhLd" and "bhLd" are displayed only for about 0.25 seconds in the first and second display sections 17 and 18, and then the displays are automatically switched. The numeric value of the tolerance (%) of the maximum value is displayed on the first display section 17 and the numeric value of the tolerance (%) of the minimum value is displayed on the second display section 18. The numeric display is continued for one second and then it is automatically returned to the character string display of "PhLd" and "bhLd." After this, the sequence is repeated. To point out explicitly that the numeric values of the tolerance concerning the maximum value and the minimum value in the first and second display sections 17 and 18 are displayed as a percentage, each numeric value indicating the tolerance is followed by the letter "p" meaning percentage in the numeric display of the fifth display mode.

The first to fifth display information and the contents displayed on the first display section 17 and the second display section 18 in each mode are listed below:

|  | First display section 17 | Second display section 18 |
|---|---|---|
| First display information | Numeric value of threshold value | Current light reception amount |
| Second display information | Tolerance (%) | Current light reception amount |

-continued

|  | First display section 17 | Second display section 18 |
|---|---|---|
| Third display information | Bar display of tolerance | Current light reception amount |
| Fourth display information | Numeric value of maximum value | Numeric value of minimum value |
| Fifth display information | Tolerance of maximum value (%) | Tolerance of minimum value (%) |

The setup threshold value can be adjusted by operating the swing-type up/down key 21 on every display mode for the first to fifth display modes described above. The threshold value when operation of the up/down key 21 is stopped is set as a new threshold value. If operation of the up/down key 21 is started on any of the third to fifth display modes, immediately the display mode is automatically switched to the second display mode. The second display mode is maintained during the operation of the up/down key 21. When operation of the up/down key 21 is stopped, the display mode is returned to the former display mode which was one of the third to fifth display modes.

Figure 5:
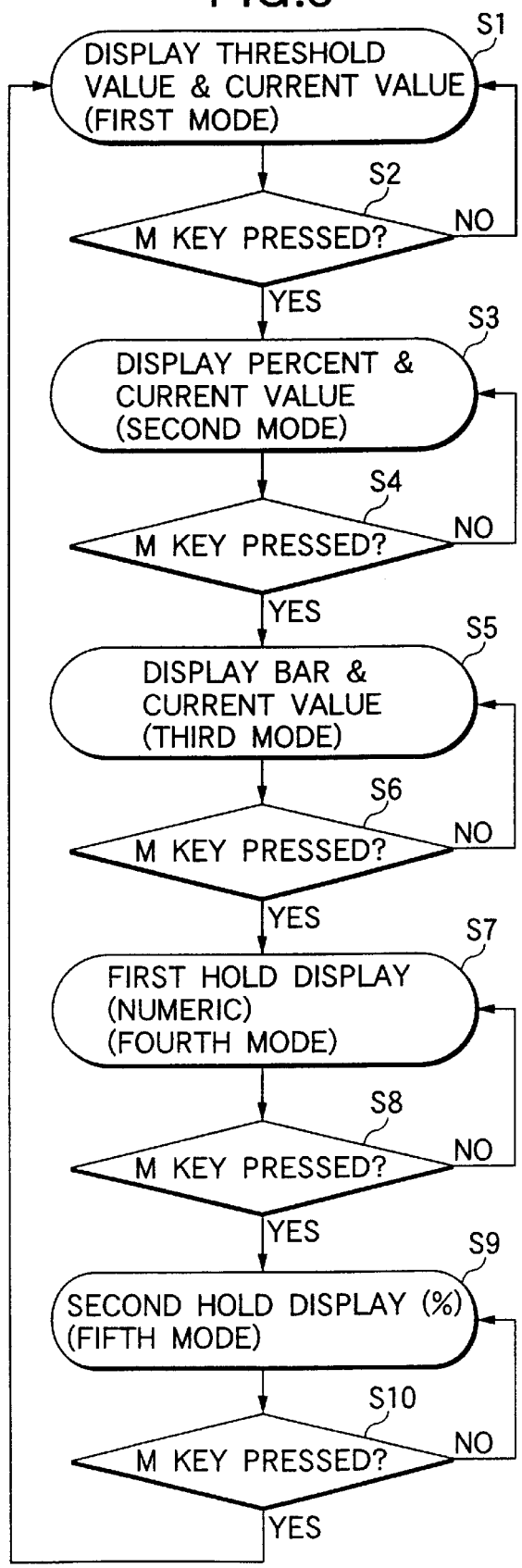
FIG. 5 is a flowchart to show the display mode changing process in the first embodiment of the invention.

FIG. 5 shows a flowchart for switching between the first display mode to the fifth display mode in order. Now assuming that the display mode of the first and second display sections 17 and 18 is the first display mode (threshold value and current light reception amount) (step S1), if the M key 23 is pressed, a transition is made from step S2 to step S3 and the first display mode is switched to the second display mode (% display of tolerance and current light reception amount). Further, if the M key 23 is pressed on the second display mode, a transition is made from step S4 to step S5 and the second display mode is switched to the third display mode (bar display of tolerance and current light reception amount). Further, if the M key 23 is pressed on the third display mode, a transition is made from step S6 to step S7 and the third display mode is switched to the fourth display mode (numeric value of the maximum value and numeric value of the minimum value). Further, if the M key 23 is pressed on the fourth display mode, a transition is made from step S8 to step S9 and the fourth display mode is switched to the fifth display mode (% display of tolerance of maximum value and % display of tolerance of minimum value). Further, if the M key 23 is pressed on the fifth display mode, a return is made from step S10 to step S1 and the fifth display mode is switched back to the first display mode.

Thus, the first to fifth display modes are switched in order, but may be switched in any order. For example, the second display mode may be switched to the fourth display mode with the third display mode skipped. The second and fourth display modes may be switched alternately with the third display mode skipped. Likewise, the first and second display modes may be switched alternately. If the M key 23 is pressed for a short time, the first to third display modes may be circulated. If the M key 23 is pressed for a long time (for example, pressed continuously for three seconds), immediately the display mode may be switched to the fourth or fifth display mode.

As described above, the tolerance and the current light reception amount are displayed at the same time on the second display mode and the third display mode. Thus, as the threshold value is adjusted on the second display mode, to finely adjust the threshold value in response to the detection environment, the operator can immediately know the fact that the photoelectric switch is close to the performance limit to function as a detection switch, for example, by visually checking that the light reception amount is extremely small. Therefore, the worker can reassess the detection environment and immediately improve it while adjusting the threshold value. In the related art, it was not possible to optimize the threshold value until the threshold value was determined through several trial and error procedures. On the other hand, according to the photoelectric switch 100 of the embodiment, improvement of the detection environment and optimization of the threshold value can be carried out efficiently.

When at least either of the first and second display sections 17 and 18 is implemented as two-color LEDs, the worker may be aggressively informed of the fact that the photoelectric switch is close to the performance limit for functioning as a detection switch described above by displaying at least either of the first and second display sections 17 and 18 in a different color from the normal color.

The maximum value and the minimum value of the light reception amounts are displayed at the same time on the fourth display mode and the fifth display mode. Thus, the worker can visually check whether or not the light reception amount difference is sufficient for detecting the presence or absence of a detected object T even in a detection environment where the detected object T moves at a high speed.

The invention has been described by taking the reflection-type and integral-type photoelectric switch 100 comprising the optical fibers 14 and 15 as an example. However, the invention can be applied to any other photoelectric switch comprising a dual display section. FIGS. 6, 8, 9, and 10 show other types of photoelectric switches each comprising a dual display section by way of example. Elements similar to those of the photoelectric switch 100 of the embodiment described above are denoted by the same reference numerals in FIGS. 6, 8, 9, and 10 and will not be discussed again. The characteristics of the photoelectric switches shown in FIGS. 6, 8, 9, and 10 will be discussed.

Figure 6:
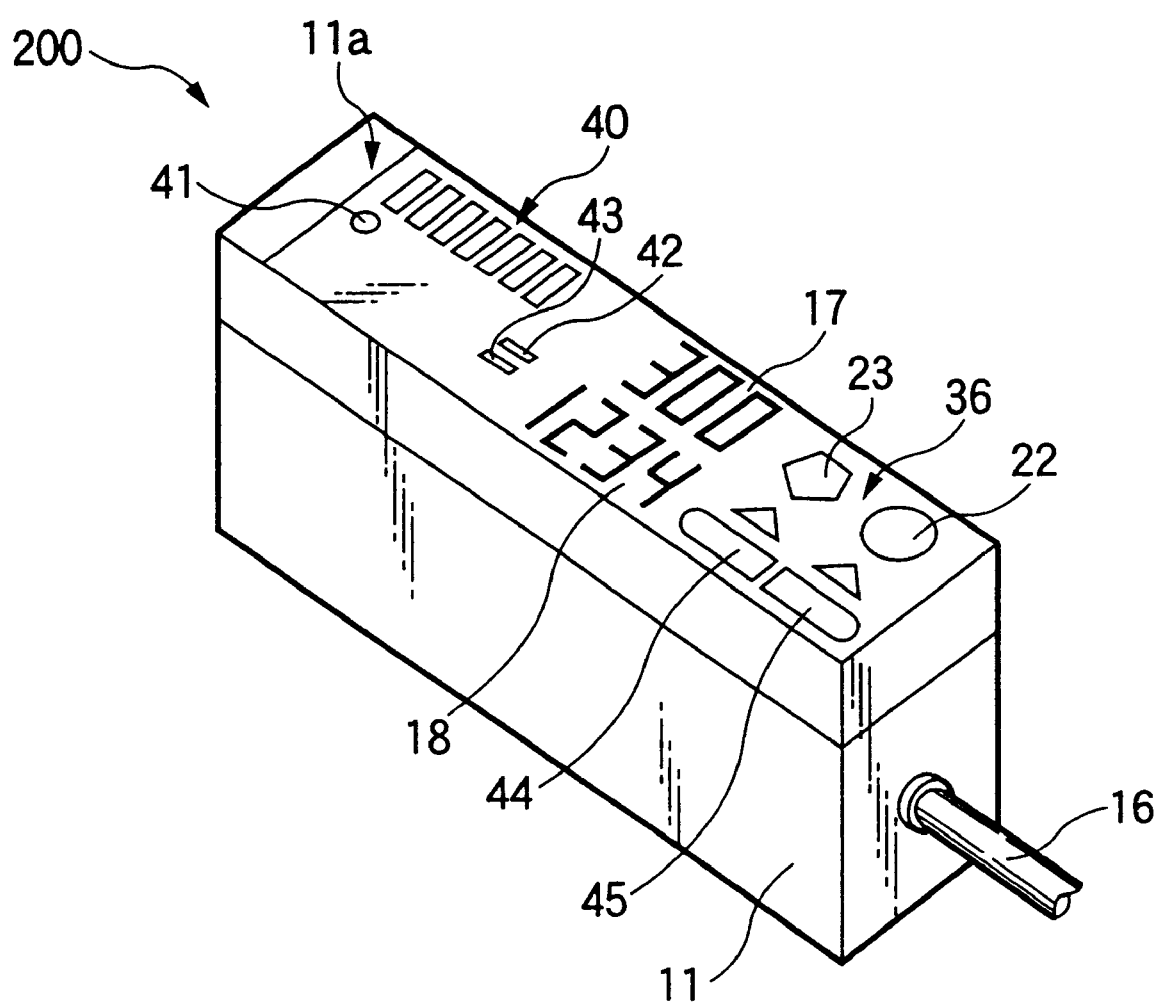
FIG. 6 is a perspective view of a photoelectric switch according to a second embodiment of the invention.

FIG. 6 shows a photoelectric switch 200 of a laser type wherein a light emission element and a light reception element (not shown in FIG. 6) are placed on one end face of a casing 11. Light emitted from the light emission element 12 is applied to a detected object T and reflected light is received directly by the light reception element 13. The photoelectric switch 200 adopts a semiconductor laser light emission element as the light emission element 12.

A first display section 17 and a second display section 18 are placed adjacent to each other in an up and down fashion on a top face 11a of the casing 11 of the photoelectric switch 200. A bar type LED monitor 40, a light emission indicator 41, a first hold mode indicator 42, and a second hold mode indicator 43 are also placed on the top face 11a of the casing 11 The above-mentioned swing-type threshold value adjustment switch 21 contained in the first embodiment is implemented as two separate key switches of an up key switch 44 and a down key switch 45.

The bar LED monitor 40 displays that the electric current value corresponding to the light reception amount received by the light reception element 13 exists in a range of ±15% from a predetermined value. When light is emitted from the light emission element 12, the light emission indicator 41 is turned on. When light emission from the light emission element 12 is stopped, the light emission indicator 41 is turned off. The first hold mode indicator 42 is turned on when a first hold mode for holding the maximum value of the emission amount of light received by the light reception element 13 is selected. The second hold mode indicator 43 is turned on when a second hold mode for holding the minimum value of the emission amount of light received by the light reception element 13 is selected.

Figure 7:
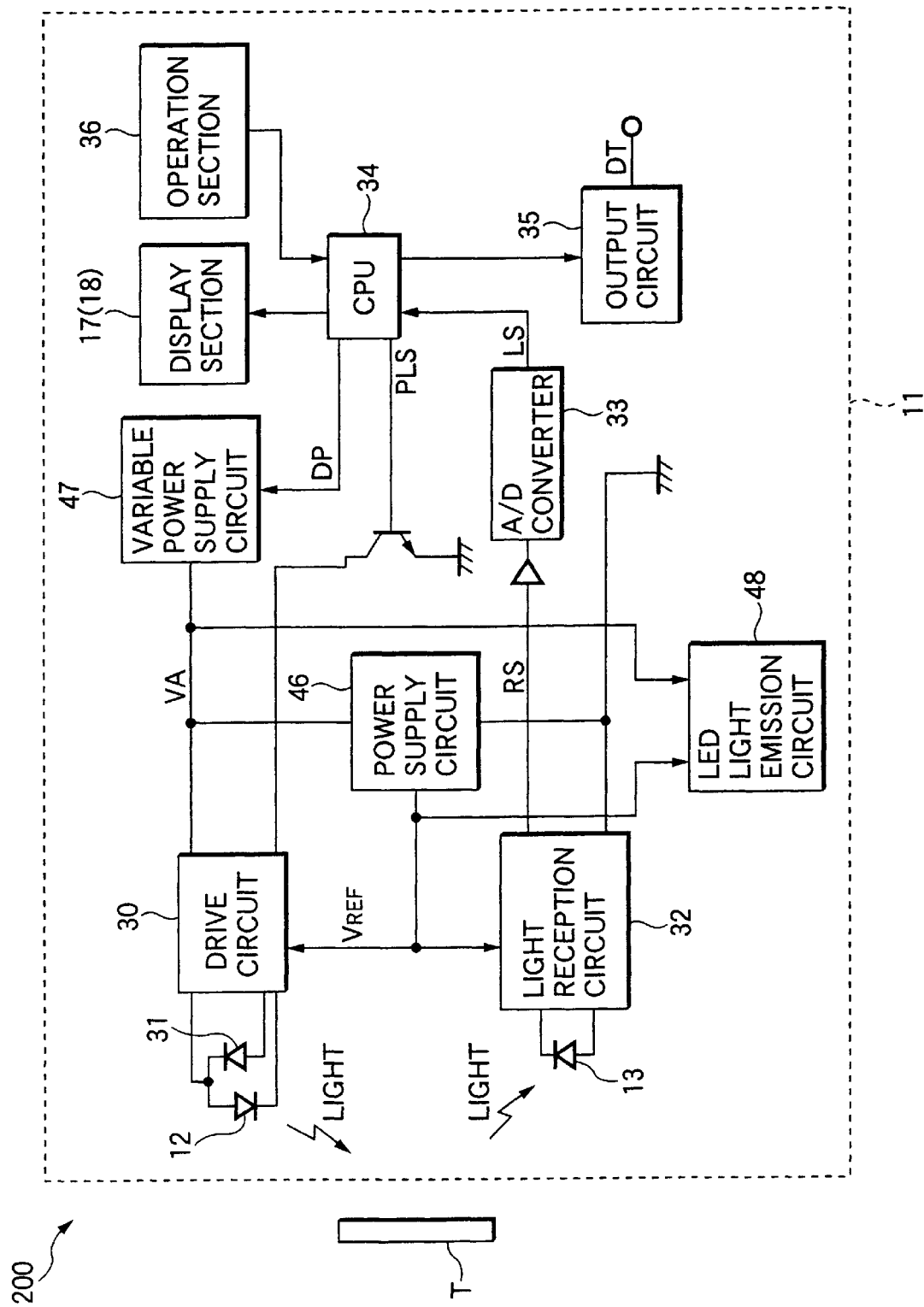
FIG. 7 is a circuit diagram of the photoelectric switch in FIG. 6.

FIG. 7 is a circuit diagram of the laser-type photoelectric switch 200 according to the second embodiment of the invention. The photoelectric switch 200 in the second embodiment adopts the laser light emission element and thus comprises a power supply circuit 46 and a variable power supply circuit 47. The photoelectric switch 200 also comprises a light emission circuit 48 for the bar type LED monitor 40.

Figure 8:
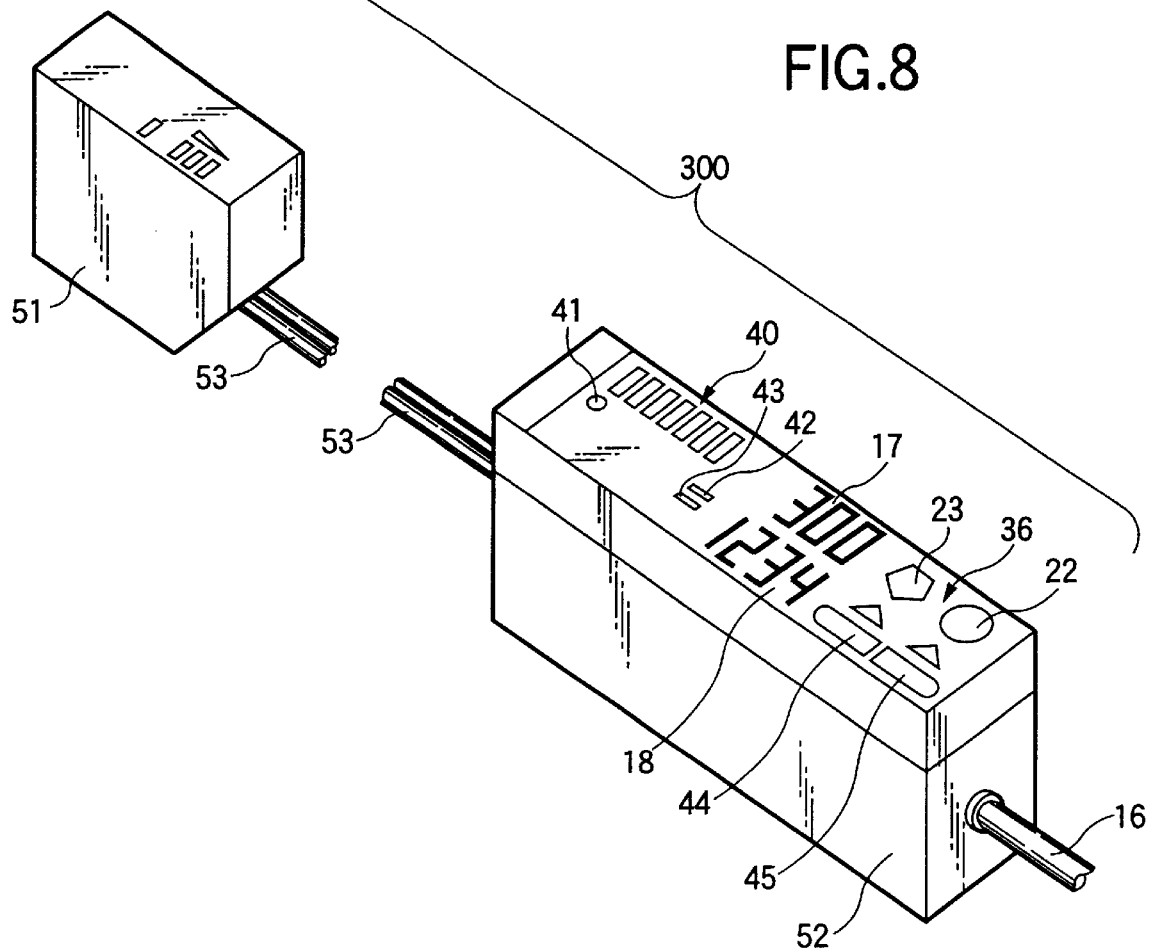
FIG. 8 is a perspective view of a separate-type photoelectric switch of a third embodiment of the invention.

FIG. 8 shows a photoelectric switch 300 of a reflection-type and a separate-type according to a third embodiment of the invention. The photoelectric switch 300 includes a head unit 51 and a main unit 52. The head unit 51 includes a light emission element and a light reception element. The main unit 52 includes an amplifier, a CPU, etc. The head unit 51 and the main unit 52 are connected by a cable 53. First and second display sections 17 and 18 and an operation section 36 are placed on the main unit 52 of the photoelectric switch 300.

Figure 9:
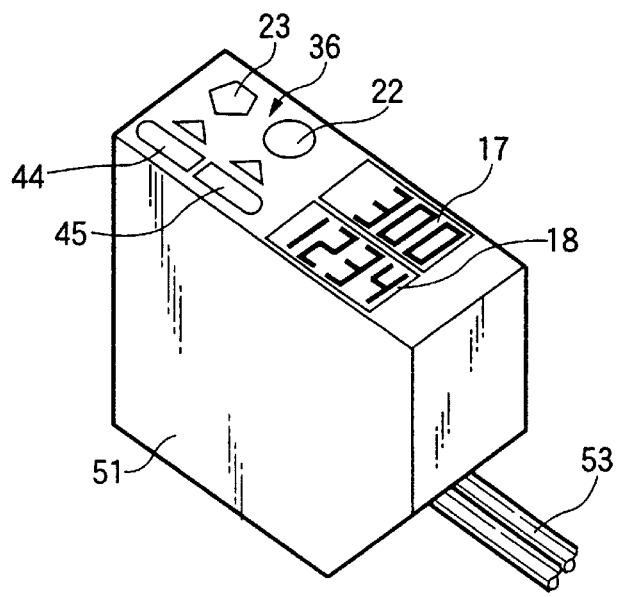
FIG. 9 is a perspective view of a head unit showing a modified example of the photoelectric switch in FIG. 8.

FIG. 9 is a modified example of the photoelectric switch 300 in FIG. 8, wherein the first and second display sections 17 and 18 are also placed on the head unit 51. In this case, the operation section 36 may also be placed on the head unit 51, as shown in FIG. 9.

Figure 10:
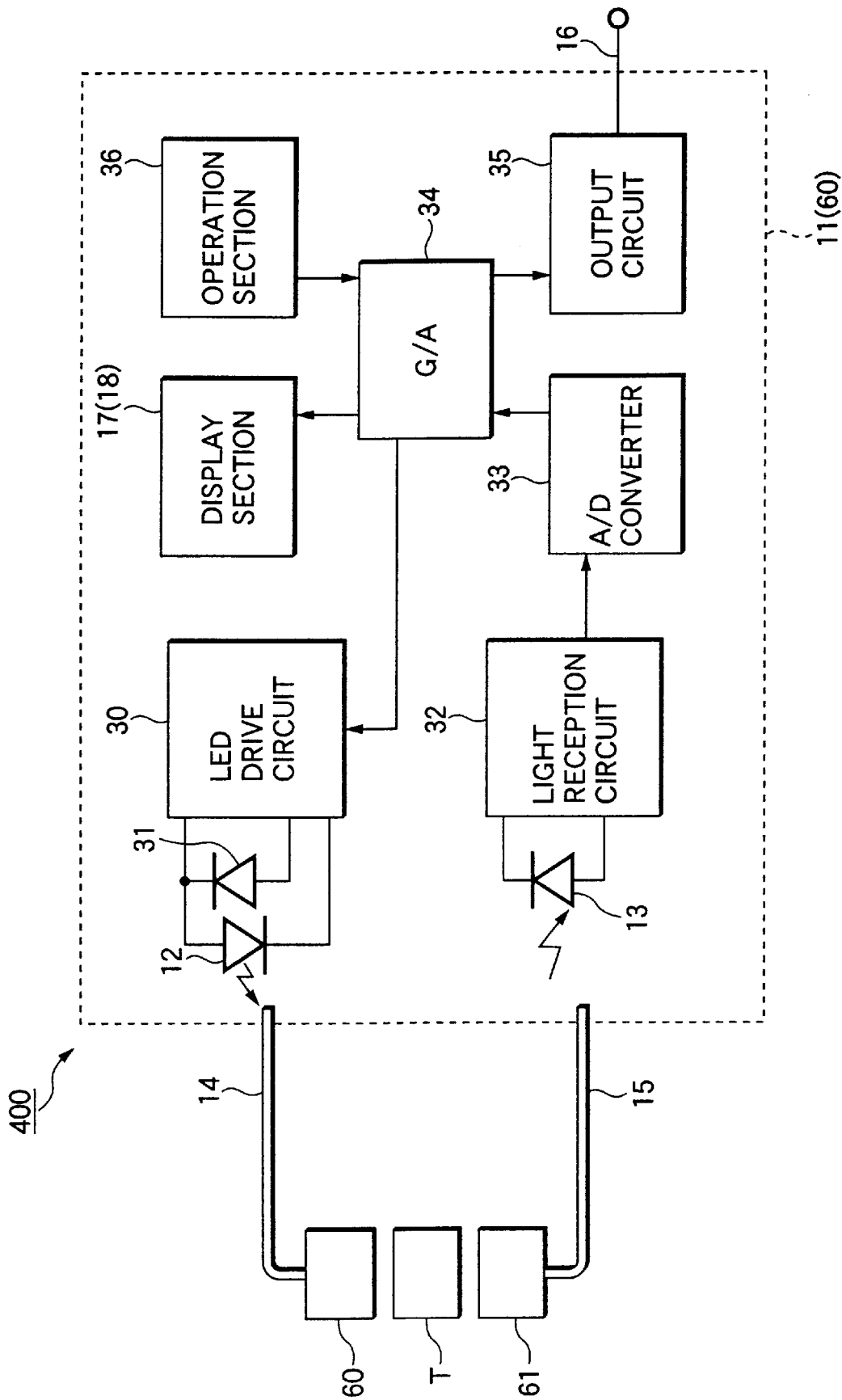
FIG. 10 is a circuit diagram of a transmission-type photoelectric switch.

FIG. 10 is a circuit diagram of a photoelectric switch 400 of a transmission-type comprising a light emission head 60 and a light reception head 61. In the transmission-type photoelectric switch 400 shown in the figure, an operation section 36 and first and second display sections 17 and 18 are placed on a main unit (not shown). The first and second display sections 17 and 18 may be placed on the light emission head 60 or the light reception head 61. The operation section 36 may also be placed on the light emission head 60 and/or the light reception head 61.

The embodiments of the invention and the modified examples have been described. It may also be made possible to switch the display of the photoelectric switches 100 to 400 between a full display mode ("Full" mode) for displaying all of the first to fifth display information in FIG. 4 in order and a partial display mode ("Std" mode) for displaying only the first and second information as shown surrounded by the dashed line in FIG. 4.

In FIG. 4, if the user selects the full display mode, a full display loop or cycle is formed wherein as the user presses the M key 23, the display mode is switched from the first display mode to the second display mode, from the second display mode to the third display mode, . . . , from the fourth display mode to the fifth display mode and when the user further presses the M key 23, the display returns to the first display mode.

On the other hand, if the user selects the partial display mode, a partial display loop or cycle is formed wherein as the user presses the M key 23, the display is switched between the first display mode and the second display mode.

To select the partial display mode or the full display mode, a dedicated switch may be provided on the top face 11a of the casing 11. A selection display may be displayed on the first display section 17 and the second display section 18 for the user to select the partial display mode or the full display mode on the selection display. An example is shown in FIG. 11.

Figure 11:
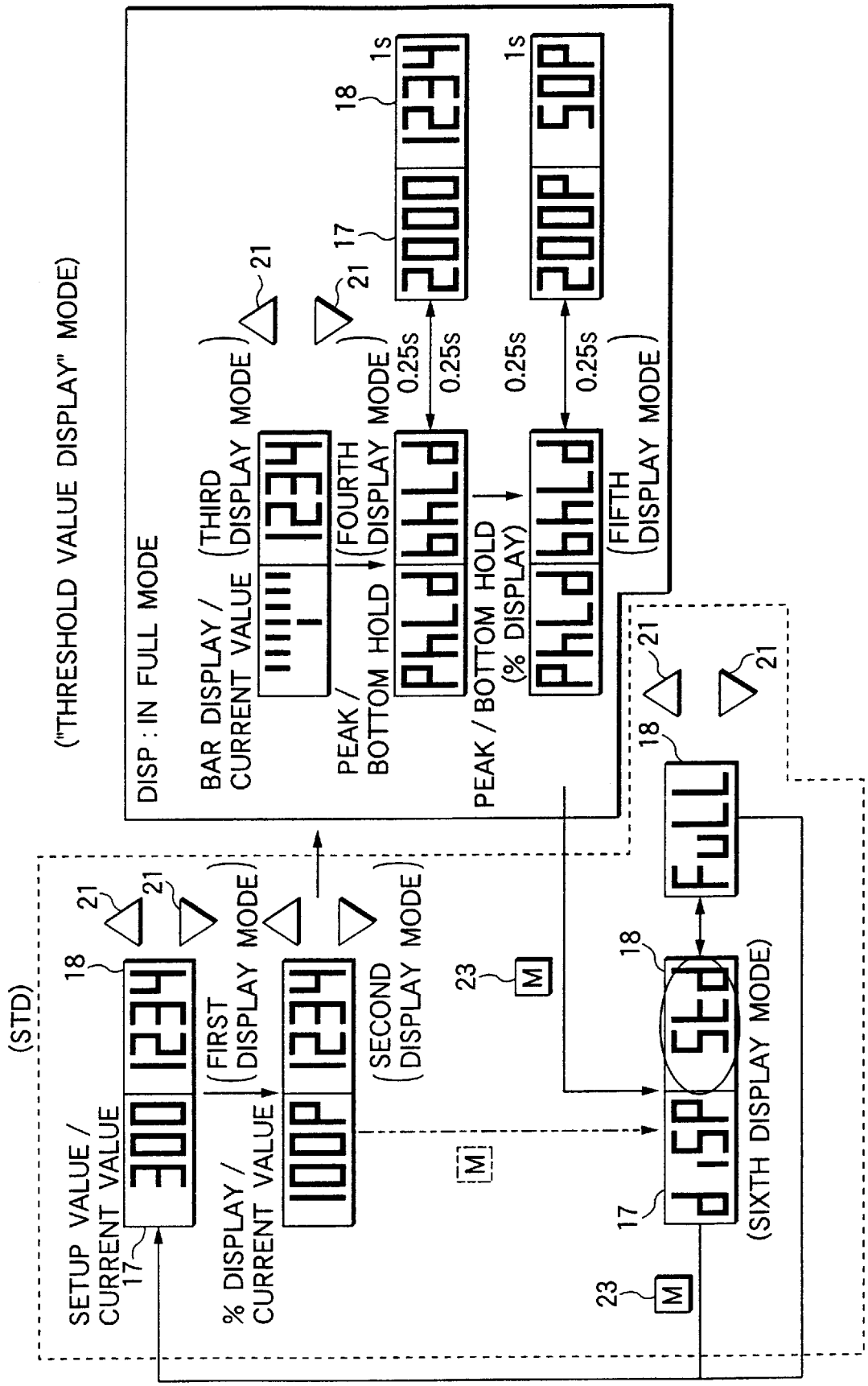
FIG. 11 is a schematic flow diagram showing the fact that the display mode in display sections can be changed.

In FIG. 11, a sixth display mode is included in addition to the first to fifth display modes as seen in comparison with FIG. 4. When the sixth display mode is selected, a sixth display information (a character string of "diSP" and character strings of "Std" and "Full") is displayed on the first and second display sections. That is, on the sixth display mode, a character string of "diSP" is displayed on the first display section on the left and character strings of "Std" and "Full" are displayed in order in the second display section 18 on the right as the up/down key 21 is operated. In FIG. 11, the character string "Std" in the second display section 18 on the sixth display mode is surrounded by an ellipse. This ellipse means that "Std" is a blinking display. That is, "Std" or "Full" in the second display section 18 is a blinking display, thereby visually displaying that any other option is contained.

The character string "diSP" is short for display and it means the display mode. The character string "Std" is short for standard and it means the partial display mode. The character string "Full" means the full display mode.

The user operates the up/down key 21 to call the character string "Std" in the second display section 18 and then presses the M key 23, whereby the display mode in the first and second display sections 17 and 18 is set to the partial display mode. In the partial display mode, a partial display loop or cycle is formed wherein as the user presses the M key 23, the display mode is switched from the first display mode to the second display mode and from the second display mode to the sixth display mode and is returned from the sixth display mode to the first display mode. The user operates the up/down key 21 to call the character string "Full" in the second display section 18 and then presses the M key 23, whereby the display mode in the first and second display sections 17 and 18 is set to the full display mode. In the full display mode, a full display loop or cycle is formed wherein as the user presses the M key 23, the display mode is switched from the first display mode to the second display mode, from the second display mode to the third display mode, from the third display mode to the fourth display mode, from the fourth display mode to the fifth display mode, and from the fifth display mode to the sixth display mode. When the user further presses the M key 23, the display returns from the sixth display mode to the first display mode.

Figure 12:
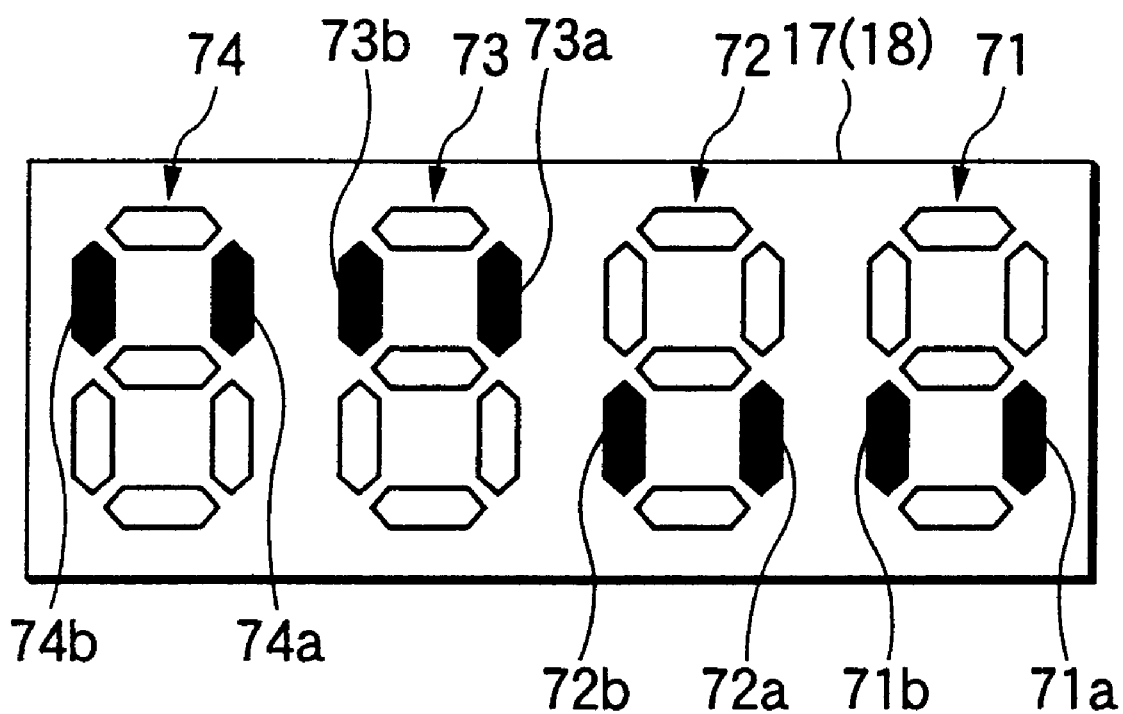
FIG. 12 is a front view showing an example of display in a bar form using longitudinal segments at upper and lower positions of seven-segment units placed side by side.

As for the display in bar form in the first display section 17 on the third display mode shown in FIG. 4, as shown in FIG. 12, four seven-segment elements 71 to 74 may be grouped into the left and right, and four longitudinal segments 71a, 71b, 72a, and 72b at lower positions (or upper positions) of the right two seven-segment elements 71 and 72 may be used and four longitudinal segments 73a, 73b, 74a, and 74b at upper positions (or lower positions) of the left two seven-segment elements 73 and 74 may be used for producing the bar display for showing the tolerance.

By using the bar display form in FIG. 12, the magnitude of the tolerance can be known, for example, by emitting light to the longitudinal segments at the left positions in order with an increase in the tolerance starting at the right longitudinal segment 71a. From the fact that in the two intermediate seven-segment elements 72 and 73, the longitudinal segment 72b at the left of the right seven-segment element 72 and the longitudinal segment 73a at the right of the left seven-segment element 73 are spaced apart up and down, the user recognizes that the threshold value exists therebetween. That is, the longitudinal segments for the lower parts of the right two seven-segment elements 71 and 72 and the longitudinal segments for the upper parts of the left two seven-segment elements 73 and 74 are used. Thus a difference in level (the position difference between up and down) appears on the bar indicating the tolerance extending from the right to left and this informs the operator that the level difference is the threshold value level.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

The text of Japanese priority application no. 2001-073338 filed Mar. 15, 2001 is hereby incorporated by reference.

What is claimed is:

1. A photoelectric switch comprising:
   a first display section and a second display section, the first display section and the second display section displaying at least one of a first display information and a second display information,
   wherein the first display information has a threshold value displayed on the first display section and a current light reception amount displayed on the second display section, and
   the second display information has a tolerance value displayed on the first display section and the current light reception amount displayed on the second display section.

2. The photoelectric switch as claimed in claim 1, further comprising:
   a switch for switching information displayed on the first and second display sections between the first display information and the second display information.

3. The photoelectric switch as claimed in claim 1, wherein the tolerance value displayed on the first display section is numerically displayed.

4. The photoelectric switch as claimed in claim 1, wherein the first display section includes seven-segment LEDs, and the tolerance displayed on the first display section is displayed in a bar form.

5. The photoelectric switch as claimed in claim 1, wherein the first and second display sections each display one of the first display information, the second display information, and a third display information,
   wherein the third display information has a maximum value of the current light reception amount displayed on one of the first and second display sections and a minimum value of the current light reception amount displayed on the other of the first and second display sections.

6. The photoelectric switch as claimed in claim 5, further comprising:
   a switch for switching information displayed on the first and second display sections among the first display information, the second display information, and the third display information.

7. The photoelectric switch as claimed in claim 5, wherein the first and second display sections display one of the first display information, the second display information, the third display information, and a fourth display information,
   wherein the fourth display information has a tolerance value of a maximum value of the current light reception amount displayed on one of the first and second display sections and a tolerance value of a minimum value of the current light reception amount displayed on the other of the first and second display sections.

8. The photoelectric switch as claimed in claim 7, further comprising:
   a switch for switching information display on the first and second display sections among the first display information, the second display information, the third display information, and the fourth display information.

9. The photoelectric switch as claimed in claim 1, wherein the first and second display sections display one of the first display information, the second display information, and a further display information,
   where the further display information has a tolerance value of a maximum value of the current light reception amount displayed on one of the first and second display sections and a tolerance value of a minimum value of the current light reception amount displayed on the other of first and second display sections.

10. The photoelectric switch as claimed in claim 9, further comprising:
   a switch for switching information displayed on the first and second display sections among the first display information, the second display information, and the further display information.

11. The photoelectric switch as claimed in claim 1, further comprising:
   a casing,
   wherein the first and second display sections are disposed on one face of the casing.

12. The photoelectric switch as claimed in claim 11, wherein the casing has an elongated rectangular top face, on which the first and second display sections are disposed side by side along a lengthwise direction of the top face of the casing.

13. The photoelectric switch as claimed in claim 12, further comprising:
   a first switch for setting the threshold value according to the current light reception amount, the first switch being disposed on one end part of the top face in the lengthwise direction of the top face; and
   a second switch for adjusting the threshold value, the second switch being disposed on the other end part of the top face in the lengthwise direction of the top face.

14. The photoelectric switch as claimed in claim 12, further comprising:
   a first switch for setting the threshold value according to the current light reception amount, the first switch being disposed on one end part of the top face in the lengthwise direction of the top face; and
   a further switch for switching information displayed on the first and second display sections between the first display information and the second display information, the further switch being disposed on the other end part of the top face in the lengthwise direction of the top face.

15. The photoelectric switch as claimed in claim 11, wherein the first and second display sections are disposed adjacent to each other so as to be positioned side by side on one face of the casing.

16. The photoelectric switch as claimed in claim 1, wherein said photoelectric switch is a separate-type photoelectric switch including a head unit for emitting light to an object to be detected and receiving light from the object, and a main unit for processing light received from the head unit,
   wherein the first and second display sections are disposed on at least one of the head unit and the main unit.

17. The photoelectric switch as claimed in claim 1, wherein said photoelectric switch is a transmission-type photoelectric switch including a light emission head for emitting light to an object to be detected, a light reception head for receiving light passing through the object, and a main unit for processing the received light from the light reception head,
   wherein the first and second display sections are disposed on at least one of the light emission head, the light reception head, and the main unit.

18. A method of operating a photoelectric switch comprising the steps of:
   displaying a first display information on a first display section and a second display section of the photoelectric switch, including displaying a threshold value on the first display section and displaying a current light amount on the second display section; and
   displaying a second display information on the first display section and the second display section, including displaying a tolerance value on the first display section and the current light amount on the second display section.

19. The method of operating the photoelectric switch as claimed in claim 18, further comprising the step of:
   providing a switch for switching information displayed on the first and second display sections between the first display information and the second display information.

20. The method of operating the photoelectric switch as claimed in claim 18, wherein said step of displaying a second display information includes numerically displaying the tolerance value on the first display section.

21. The method of operating the photoelectric switch as claimed in claim 18, further comprising the step of providing seven-segment LEDs as the first display section, and wherein said step of displaying a second display information includes displaying the tolerance value on the first display section in a bar type form.

22. The method of operating the photoelectric switch as claimed in claim 18, further comprising the step of:
   displaying a third display information on the first display section and the second display section of the photoelectric switch, including displaying a maximum value of the current light reception amount on one of the first and second display sections and displaying a minimum value of the currently light reception amount on the other of the first and second display sections.

23. The method of operating the photoelectric switch as claimed in claim 22, further comprising the step of:
   providing a switch for switching information displayed on the first and second display sections between the first display information, the second display information and the third display information.

24. The method of operating the photoelectric switch as claimed in claim 22, further comprising the step of:
   displaying a fourth display information on the first display section and the second display section of the photoelectric switch, including displaying a tolerance value of a maximum value of the current light reception amount on one of the first and second display sections and displaying a tolerance value of a minimum value of the currently light reception amount on the other of the first and second display sections.

25. The method of operating the photoelectric switch as claimed in claim 24, further comprising the step of:
   providing a switch for switching information displayed on the first and second display sections between the first display information, the second display information, the third display information and the fourth display information.

26. The method of operating the photoelectric switch as claimed in claim 18, further comprising the step of:
   displaying a further display information on the first display section and the second display section of the photoelectric switch, including displaying a tolerance value of a maximum value of the current light reception amount on one of the first and second display sections and displaying a tolerance value of a minimum value of the current light reception amount on the other of the first and second display sections.

27. The method of operating the photoelectric switch as claimed in claim 26, further comprising the step of:

providing a switch for switching information displayed on the first and second display sections between the first display information, the second display information and the further display information.

28. The method of operating the photoelectric switch as claimed in claim 18, further comprising the step of:

providing a casing wherein the first and second display sections are disposed on one face of the casing.

29. The method of operating the photoelectric switch as claimed in claim 28, wherein said step of providing a casing includes providing the casing with an elongated rectangular top face on which the first and second display sections are disposed side by side in a lengthwise direction of the top face.

30. The method of operating the photoelectric switch as claimed in claim 29, further comprising the steps of:

providing a first switch for setting the threshold value according to the current light reception amount, including disposing the first switch on one end part of the top face in the lengthwise direction of the top face; and providing a second switch for adjusting the threshold value, including disposing the second switch on the other end part of the top face in the lengthwise direction of the top face.

31. The method of operating the photoelectric switch as claimed in claim 29, further comprising the steps of:

providing a first switch for setting the threshold value according to the current light reception amount, including disposing the first switch on one end part of the top face in the lengthwise direction of the top face; and providing a further switch for switching information displayed on the first and second display sections between the first display information and the second display information, including disposing the third switch on the other end part of the top face in the lengthwise direction of the top face.

32. The method of operating the photoelectric switch as claimed in claim 28, wherein said step of providing a casing includes disposing the first and second display sections side by side on one face of the casing.

33. The method of operating the photoelectric switch as claimed in claim 18, comprising the steps of:

providing a separate-type photoelectric switch including a head unit for emitting light to an object to be detected and receiving light from the object, and further including a main unit for processing light received from the head unit, and disposing the first and second display sections on at least one of the head unit and the main unit.

34. The method of operating the photoelectric switch as claimed in claim 18, comprising the steps of:

providing a transmission-type photoelectric switch including a light emission head for emitting light to an object to be detected, a light reception head for receiving light passing through the object, and a main unit for processing the received light from the light reception head; and disposing the first and second display sections on at least one of the light emission head, the light reception head and the main unit.

* * * * *